(12) United States Patent
Kumarasamy et al.

(10) Patent No.: US 12,426,191 B2
(45) Date of Patent: Sep. 23, 2025

(54) SELF-RETRACTABLE EJECTOR ASSEMBLY FOR AUGMENTED FIELD REPLACEABLE UNIT (FRU) EXTRACTION

(71) Applicant: Infinera Corp., San Jose, CA (US)

(72) Inventors: Sundaresan Kumarasamy, Puducherry (IN); Jatin Kohli, Karnataka (IN)

(73) Assignee: Infinera Corp.

( * ) Notice: Subject to any disclaimer, the term of this patent is extended or adjusted under 35 U.S.C. 154(b) by 104 days.

(21) Appl. No.: 18/541,935

(22) Filed: Dec. 15, 2023

(65) Prior Publication Data

US 2024/0206099 A1 Jun. 20, 2024

Related U.S. Application Data

(60) Provisional application No. 63/433,686, filed on Dec. 19, 2022.

(51) Int. Cl.
H05K 7/14 (2006.01)

(52) U.S. Cl.
CPC ......... H05K 7/1401 (2013.01); H05K 7/1489 (2013.01)

(58) Field of Classification Search
CPC .. H05K 7/1401; H05K 7/1489; H05K 7/1487; G06F 1/186

USPC ............................................ 312/332.1, 223.2
See application file for complete search history.

(56) References Cited

U.S. PATENT DOCUMENTS

| 11,523,532 | B2* | 12/2022 | Liu | H05K 7/1488 |
|---|---|---|---|---|
| 2019/0090375 | A1* | 3/2019 | Hsue | H05K 7/1489 |
| 2023/0144465 | A1* | 5/2023 | Chia | H05K 7/1409 |
| | | | | 312/223.2 |
| 2023/0305606 | A1* | 9/2023 | Chen | G11B 33/127 |
| 2024/0215192 | A1* | 6/2024 | Lee | H05K 7/1401 |

* cited by examiner

*Primary Examiner* — Kimberly T Wood

(57) ABSTRACT

Assemblies and methods of construction are disclosed herein, including an assembly for ejecting a line module from an equipment bay of a chassis, comprising: an ejector block movable between neutral and ejecting positions and configured to apply a force to the chassis when the ejector block is moved into the ejecting position, thereby moving the line module away from the chassis; guide pins configured to guide movement of the ejector block between the neutral and ejecting positions; a mounting bracket attached to the front panel and extending away from the front panel and having a bracket opening; an ejector lever having a handle end, a pivot portion, and a load end, the pivot portion having a pivot opening; and a fastener positioned through the bracket opening and the pivot opening such that the ejector lever is pivotable about the fastener between a closed position and an open position.

20 Claims, 7 Drawing Sheets

SELF-RETRACTABLE EJECTOR ASSEMBLY FOR AUGMENTED FIELD REPLACEABLE UNIT (FRU) EXTRACTION

CROSS-REFERENCE TO RELATED APPLICATIONS

This application claims priority to the provisional patent application identified by U.S. Ser. No. 63/433,686, filed Dec. 19, 2022, the entire content of which is hereby expressly incorporated herein by reference.

BACKGROUND

Network computing devices, such as servers, switches, routers, and other electronic devices or systems, typically comprise a metallic enclosure (known as a "chassis") and line modules (such as "field replaceable units" (FRUs)) which may be coupled to the chassis through a backplane or bridge connectors.

Existing chassis typically include features such as a front panel, a rear panel, FRU slots, partition guides, a top cover, a bottom cover, circuit boards, electronic devices, heatsinks, and supporting mechanical elements. In some cases, the chassis may also include a plurality of sub-slots, which offer additional support for various tributary interfaces and can house modules of varying widths, including double-width modules. The FRUs may comprise circuit boards, connectors, programmable devices, fan modules, heatsinks, power supply units, and electronic modules with input/output (I/O) ports.

Un-mating and disengaging the FRU from the chassis often requires an ejector mechanism, especially given the significant extraction forces involved, which can exceed 80 Newtons for many systems. Certain FRUs, such as those with dual-stack printed circuit board assemblies (PCBAs) and backplanes, can require even larger insertion and extraction forces. For example, a double-slot card FRU may require an insertion force of up to 212.3 Newtons and an extraction force of 157.6 Newtons.

However, commercially available ejectors often face compatibility issues with existing chassis and may not be suitable for FRU insertion and extraction. Additionally, they may interfere with the insertion or extraction of other FRUs already installed in the chassis. Moreover, existing ejectors often require the addition of unique slots or features to the chassis, which can potentially damage the chassis or be problematic on uneven chassis surfaces.

In view of these limitations, there is a need for an ejector mechanism that is: compatible with existing chassis designs (i.e., the ejector should not require significant modifications to the chassis or interfere with existing features); capable of providing high insertion and extraction forces (i.e., the ejector should be efficient enough to provide the significant forces required for certain FRUs, including double-slot cards); non-interfering (i.e., the ejector should not hinder the insertion or extraction of other FRUs in the chassis); universal (i.e., the ejector should be adaptable to different chassis configurations and avoid the need for unique slots or features); and safe (i.e., the ejector should not damage the chassis or pose any safety risks during operation).

SUMMARY OF THE INVENTION

The problem of providing an ejector mechanism that is compatible with existing chassis designs, capable of providing high insertion and extraction forces, non-interfering, universal, and safe is addressed through the assemblies and methods disclosed herein.

In one implementation, the present disclosure includes an assembly for ejecting a line module from an equipment bay of a chassis of a networking device, wherein the chassis has a back side and a front side having a chassis opening configured to receive the line module into the equipment bay of the chassis, wherein the line module is configured to be installed within the equipment bay of the chassis of the networking device, the line module having a front panel, the front panel having an exterior surface, an interior surface, a first side, and a second side positioned opposite the first side. The assembly may comprise an ejector block having an interior portion connected to the interior surface of the front panel and positioned proximate to the first side of the front panel, and an exterior portion positioned outside of the equipment bay and proximate to the front side of the chassis when the line module is installed in the equipment bay of the chassis. The ejector block may be movable between a neutral position and an ejecting position, the ejector block configured to apply a force to the front side of the chassis in a first direction toward the back side of the chassis when the ejector block is moved into the ejecting position and contacts the front side of the chassis, thereby moving the line module in a second direction away from the back side of the chassis; one or more guide pins connected to the ejector block and configured to guide movement of the ejector block between the neutral position and the ejecting position; a mounting bracket having a first end attached to the interior surface of the front panel of the line module proximate to the first side of the front panel, the mounting bracket having a second end extending away from the interior surface of the front panel and having a bracket opening; an ejector lever having a handle end, a pivot portion, and a load end, the load end positioned proximate to the exterior portion of the ejector block, the pivot portion having a pivot opening positioned proximate to the bracket opening of the second end of the mounting bracket; and a fastener positioned through the bracket opening of the second end of the mounting bracket and the pivot opening of the pivot portion of the ejector lever such that the ejector lever is pivotable about the fastener between a closed position in which the handle end is proximate to the exterior surface of the front panel of the line module and an open position in which the handle end is distanced from the exterior surface of the front panel of the line module and the load end has contacted and moved the ejector block into the ejecting position.

In one implementation, the present disclosure includes a line module assembly for an equipment bay of a chassis of a networking device, wherein the chassis has a back and a front having a chassis opening configured to receive a line module into the equipment bay of the chassis. The line module assembly may comprise a line module configured to be installed within the equipment bay of the chassis of the networking device, the line module having a front panel, the front panel having an exterior surface, an interior surface, a first side, and a second side positioned opposite the first side. The line module assembly may comprise an ejector block having an interior portion connected to the interior surface of the front panel and positioned proximate to the first side of the front panel, and having an exterior portion positioned outside of the equipment bay and proximate to the front of the chassis when the line module is installed in the equipment bay of the chassis, the ejector block movable between a neutral position and an ejecting position, the ejector block configured to apply a force to the front of the chassis in a first direction toward the back of the chassis when the ejector block is moved into the ejecting position and contacts the front of the chassis, thereby moving the line module in a second direction away from the back of the chassis. The line module assembly may comprise one or more guide pins connected to the ejector block and configured to guide movement of the ejector block between the neutral position and the ejecting position. The line module assembly may comprise a mounting bracket having a first end attached to the interior surface of the front panel of the line module proximate to the first side of the front panel, the mounting bracket having a second end extending away from the interior surface of the front panel and having a bracket opening; an ejector lever having a handle end, a pivot portion, and a load end, the load end positioned proximate to the exterior portion of the ejector block, the pivot portion having a pivot opening positioned proximate to the bracket opening of the second end of the mounting bracket. The line module assembly may comprise a fastener positioned through the bracket opening of the second end of the mounting bracket and the pivot opening of the pivot portion of the ejector lever such that the ejector lever is pivotable about the fastener between a closed position in which the handle end is proximate to the exterior surface of the front panel of the line module and an open position in which the handle end is distanced from the exterior surface of the front panel of the line module and the load end has contacted and moved the ejector block into the ejecting position.

In one implementation, the present disclosure includes a method of making a removable line module assembly for an equipment bay of a chassis of a networking device, wherein the chassis has a back and has a front having a chassis opening configured to receive a line module into the equipment bay in the chassis. The method may comprise attaching a mounting bracket to a line module configured to be installed within the equipment bay of the chassis of the networking device, the line module having a front panel, the front panel having an exterior surface, an interior surface, a first side, and a second side positioned opposite the first side, the mounting bracket having a first end attached to the interior surface of the front panel of the line module proximate to the first side of the front panel, the mounting bracket having a second end extending away from the interior surface of the front panel and having a bracket opening; positioning a pivot portion of an ejector lever such that a pivot opening of the pivot portion of the ejector lever is proximate to the bracket opening of the second end of the mounting bracket, the ejector lever having the pivot portion, a handle end, and a load end; positioning a fastener through the bracket opening of the second end of the mounting bracket and the pivot opening of the pivot portion of the ejector lever such that the ejector lever is pivotable about the fastener between a closed position in which the handle end is proximate to the exterior surface of the front panel of the line module and an open position in which the handle end is distanced from the exterior surface of the front panel of the line module. The method may comprise attaching an interior portion of an ejector block to the interior surface of the front panel, proximate to the first side of the front panel, the ejector block having an exterior portion positioned outside of the equipment bay and proximate to the front of the chassis when the line module is installed in the equipment bay of the chassis, the load end of the ejector lever positioned proximate to the exterior portion of the ejector block, the ejector block movable between a neutral position and an ejecting position, the ejector block configured to apply a force to the front of the chassis in a first direction toward the back of the chassis when the ejector block is moved into the ejecting position and contacts the front of the chassis, thereby moving the line module in a second direction away from the back of the chassis, when the load end of the ejector lever has contacted and moved the ejector block into the ejecting position. The method may comprise attaching one or more guide pins to the ejector block, the one or more guide pins configured to guide movement of the ejector block between the neutral position and the ejecting position.

BRIEF DESCRIPTION OF THE DRAWINGS

The accompanying drawings, which are incorporated in and constitute a part of this specification, illustrate one or more implementations described herein and, together with the description, explain these implementations. The drawings are not intended to be drawn to scale, and certain features and certain views of the figures may be shown exaggerated, to scale or in schematic in the interest of clarity and conciseness. Not every component may be labeled in every drawing. Like reference numerals in the figures may represent and refer to the same or similar element or function. In the drawings.

DETAILED DESCRIPTION

The following detailed description refers to the accompanying drawings. The same reference numbers in different drawings may identify the same or similar elements.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the implementations herein. This is done merely for convenience and to give a general sense of the inventive concept. This description should be read to include one or more and the singular also includes the plural unless it is obvious that it is meant otherwise.

Further, use of the term "plurality" is meant to convey "more than one" unless expressly stated to the contrary.

As used herein, qualifiers like "substantially," "about," "approximately," and combinations and variations thereof, are intended to include not only the exact amount or value that they qualify, but also some slight deviations therefrom, which may be due to manufacturing tolerances, measurement error, wear and tear, stresses exerted on various parts, and combinations thereof, for example.

The use of the term "at least one" or "one or more" will be understood to include one as well as any quantity more than one. In addition, the use of the phrase "at least one of X, V, and Z" will be understood to include X alone, V alone, and Z alone, as well as any combination of X, V, and Z.

The use of ordinal number terminology (i.e., "first", "second", "third", "fourth", etc.) is solely for the purpose of differentiating between two or more items and, unless explicitly stated otherwise, is not meant to imply any sequence or order or importance to one item over another or any order of addition.

Finally, as used herein any reference to "one implementation" or "an implementation" means that a particular element, feature, structure, or characteristic described in connection with the implementation is included in at least one implementation. The appearances of the phrase "in one implementation" in various places in the specification are not necessarily all referring to the same implementation.

Figure 1:
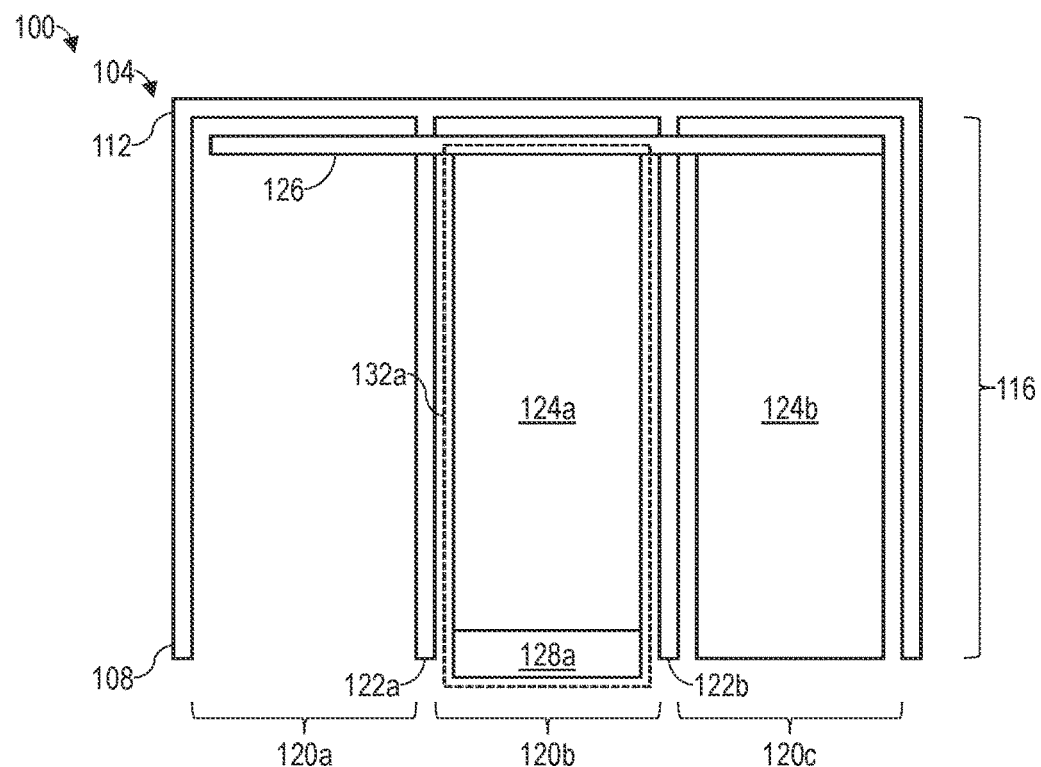
FIG. 1 is a diagrammatic top plan view of an exemplary implementation of a networking device constructed in accordance with the present disclosure.
Figure 2:
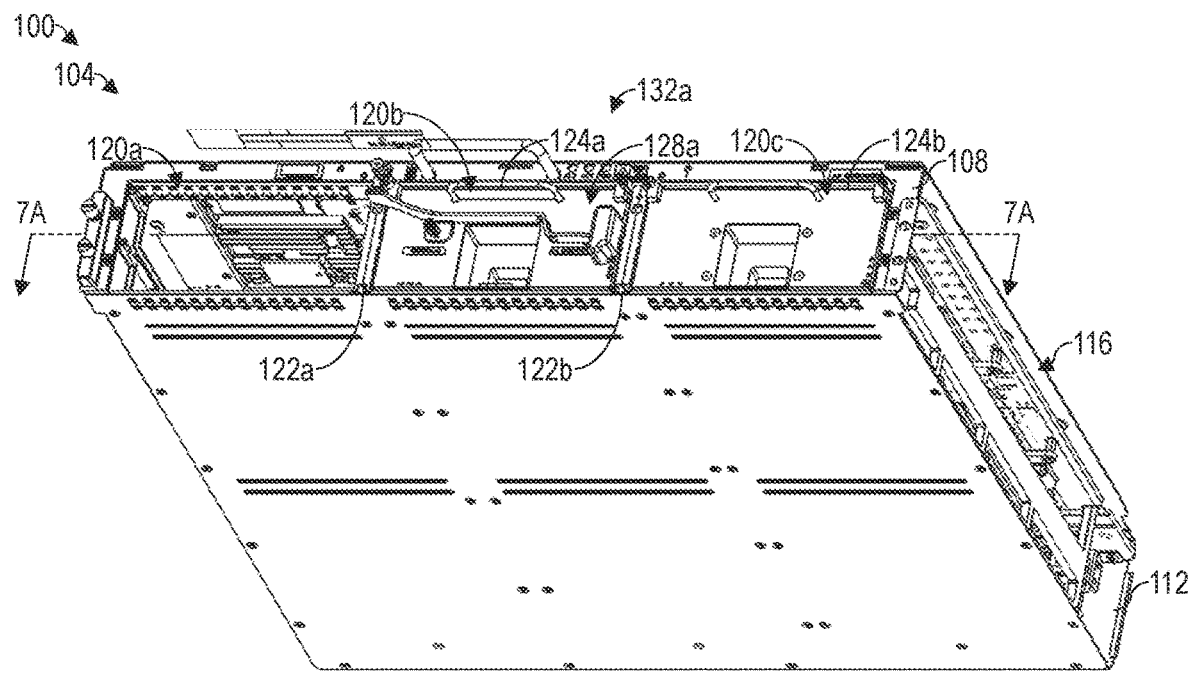
FIG. 2 is a bottom front perspective view of a chassis shown in FIG. 1.

Referring now to the drawings and in particular to FIGS. 1 and 2, shown therein are a diagrammatic top plan view and a bottom front perspective view, respectively, of a networking device 100 and a line module assembly 132 comprising a line module 124 and an ejector assembly 128, constructed in accordance with the present disclosure.

As used herein, the "networking device" 100 may comprise one or more of servers, switches, routers, Web server systems, modular units, vehicle monitoring systems, security systems, circuit boards, power supply units, other electronic devices, combinations thereof, and/or the like.

The networking device 100 may comprise a chassis 104 having a front 108, a back 112 opposite the front 108, and an equipment bay 116 between the front 108 and the back 112. The front 108 of the chassis 104 may define one or more chassis openings 120—such as a first chassis opening 120a, a second chassis opening 120b, and a third chassis opening 120c shown in FIG. 1, for example. While the chassis 104 is shown in FIGS. 1 and 2 as comprising three of the chassis openings 120, it should be understood that the chassis 104 may comprise a number of the chassis openings 120 that is greater or fewer than three.

Between each of the chassis openings 120, the front 108 of the chassis 104 may include one or more partitions 122—such as a first partition 122a and a second partition 122b shown in FIGS. 1 and 2, for example. While the chassis 104 is shown in FIGS. 1 and 2 as include two of the partitions 122, it should be understood that the chassis 104 may include a number of the partitions 122 that is greater or fewer than two.

Each of the chassis openings 120 may be configured to receive a particular one of the line modules 124 into the equipment bay 116 of the chassis 104—such as a first line module 124a and a second line module 124b shown in FIGS. 1 and 2, for example. Each of the line modules 124 may be configured to be installed within the equipment bay 116 of the chassis 104. The chassis 104 is shown in FIGS. 1 and 2 as having the first chassis opening 120a being empty for receiving another one of the line modules 124, the second chassis opening 120b receiving the first line module 124a into the equipment bay 116 of the chassis 104, and the third chassis opening 120c receiving the second line module 124b into the equipment bay 116 of the chassis 104.

As shown in FIG. 1, the equipment bay 116 may have one or more backplane connectors 126 (hereinafter, the "backplane connectors 126") positioned in the equipment bay 116 proximate to the back 112 of the chassis 104. Each of the line modules 124 may be configured to be communicatively coupled to at least one of the backplane connectors 126. Further, as described in further detail below, each of the line modules 124 may be configured to be separable from the backplane connectors 126. The separation of the line module 124 from the backplane connectors 126 requires the application of a force pulling the line module 124 away from the back 112 of the chassis 104.

While the chassis openings 120 are shown in FIGS. 1 and 2 as receiving two of the line modules 124, it should be understood that the chassis openings 120 may receive a number of the line modules 124 that is greater or fewer than two. For example, in some implementations, a particular one of the line modules 124 may be wider than a single one of the chassis openings 120. In such implementations, two or more of the chassis openings 120 may collectively receive the particular one of the line modules 124 into the equipment bay 116 of the chassis 104. In such implementations, one or more of the partitions 122 may be removed.

In accordance with the present disclosure, the line module assembly 132 may comprise the line module 124 and the ejector assembly 128 attached to the line module 124 for ejecting the particular one of the line modules 124 from the equipment bay 116 of the chassis 104 (e.g., as shown in FIGS. 1 and 2, the first line module 124a and the first ejector assembly 128a). The ejector assemblies 128 are generally configured to reduce a force required to separate the line modules 124 from the backplane connectors 126 and eject the line modules 124 from the chassis openings 120. The ejector assembly 128 may be configured to provide leverage against the chassis 104 to reduce the force required for a user to eject the line module 124, as explained herein.

Figure 3:
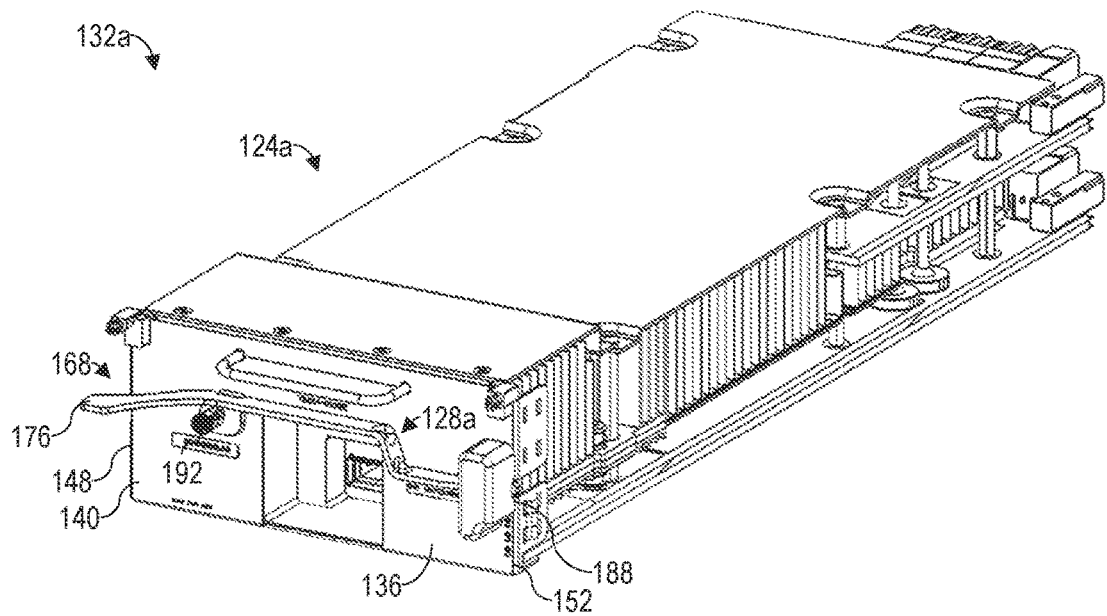
FIG. 3 is a front top perspective view of a line module assembly shown in FIG. 2.

Referring now to FIG. 3, shown therein is a front top perspective view of the first line module assembly 132a shown in FIG. 2, which will be referred to simply as the line module assembly 132 for clarity. The line module assembly 132 may comprise the line module 124 and the ejector assembly 128. The line module 124 may have a front panel 136 having an exterior surface 140, an interior surface 144 (shown in FIG. 5), a first side 148, and a second side 152 opposite the first side 148.

Figure 4:
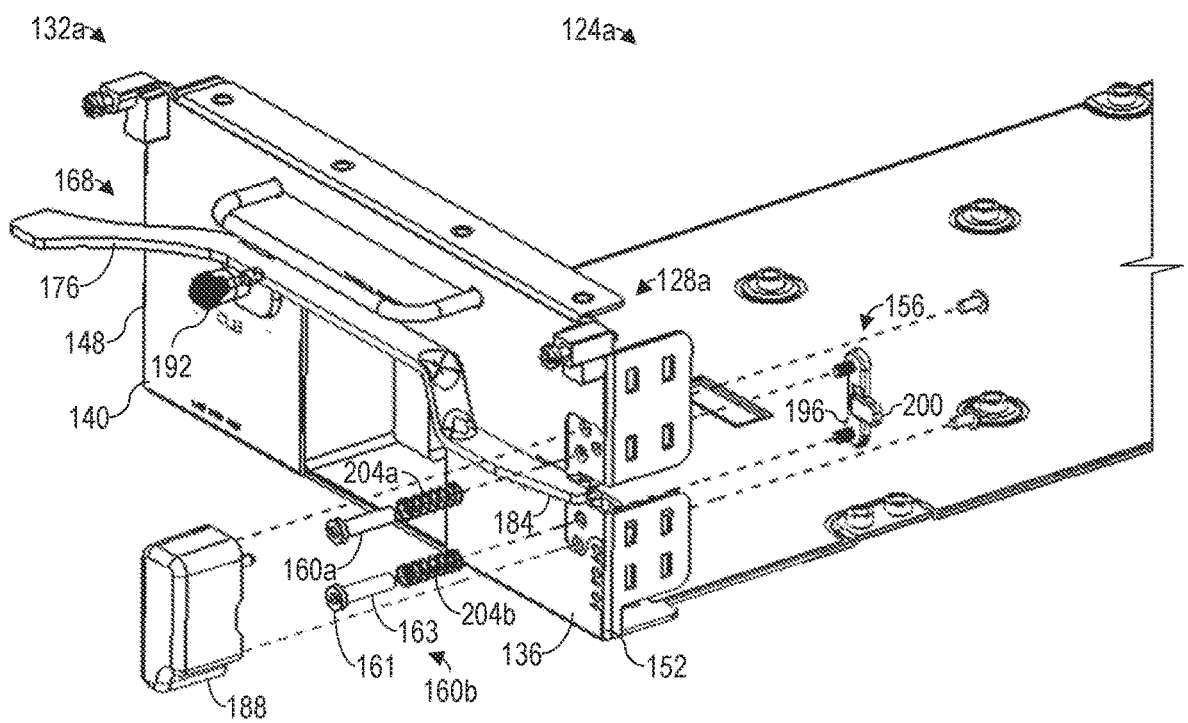
FIG. 4 is a partial perspective exploded view of the line module assembly shown in FIG. 3.
Figure 5:
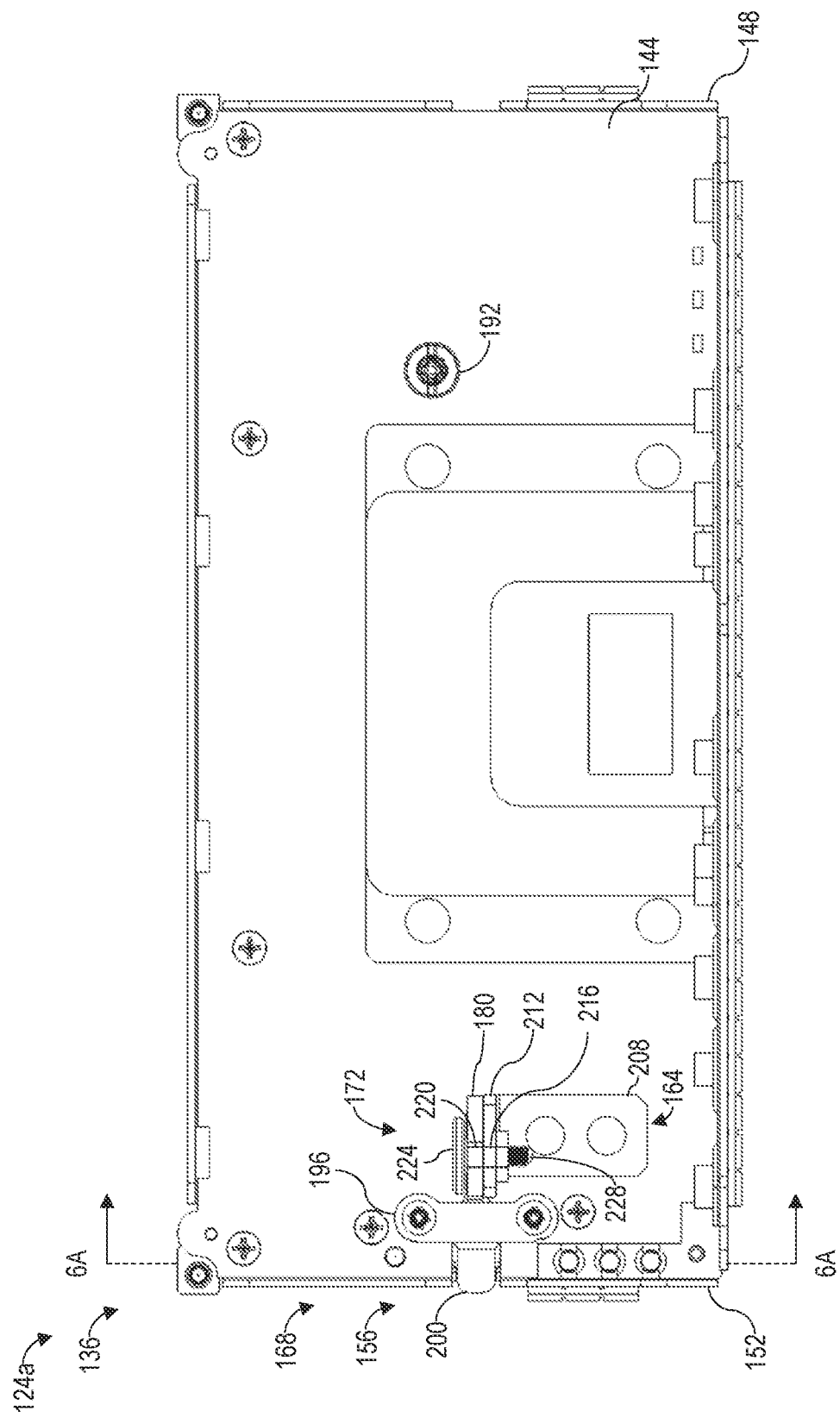
FIG. 5 is a back view of a front panel of a line module of the line module assembly shown in FIG. 4.

The ejector assembly 128 may be attached to the front panel 136 of the line module 124. As shown in FIGS. 4 and 5, the ejector assembly 128 may comprise an ejector block 156, one or more guide pins 160 (hereinafter, the "guide pins 160"), an ejector lever 168, and a fastener 172. In some implementations, the ejector assembly 128 may include a mounting bracket 164 configured to be attached to the interior surface 144 of the front panel 136 and to accept the fastener 172.

The ejector lever 168 may have a handle end 176, a pivot portion 180, and a load end 184. As described in further detail below, the ejector lever 168 may be pivotable between a closed position and an open position.

In some implementations, as shown in FIG. 3, the ejector assembly 128 may further comprise a cover block 188 disposed over the guide pins 160. As described in further detail below, the cover block 188 may be configured to limit movement of the ejector lever 168. In some implementations, the cover block 188 may be configured shield one or more of the guide pins 160, the load end 184 of the ejector lever 168, and the retainer springs 204.

In some implementations, as shown in FIG. 3, the ejector assembly 128 may further comprise a locking mechanism 192. As described in further detail below, the locking mechanism 192 may be configured to selectively maintain the ejector lever 168 in a closed position.

Referring now to FIG. 4, shown therein is a partial exploded view of the line module assembly 132 shown in FIG. 3 in conjunction with components of the line module 124. In this view, the ejector block 156, the guide pins 160 (i.e., a first guide pin 160a and a second guide pin 160b), and the load end 184 of the ejector lever 168 are visible.

The ejector block 156 may have an interior portion 196 and an exterior portion 200. The interior portion 196 may be connected to the interior surface 144 (shown in FIG. 5) of the front panel 136 of the line module 124 and positioned proximate to the second side 152 of the front panel 136 of the line module 124. The exterior portion 200 may be positioned outside of the equipment bay 116 of the chassis 104 and proximate to the front 108 of the chassis 104 when the line module 124 is installed in the equipment bay 116 of the chassis 104. In some implementations, the exterior portion 200 may be positioned outside of the equipment bay 116 of the chassis 104 and proximate to the front 108 of the chassis 104—such as the partition 122 or other front surface of the front 108 of the chassis 104—when the line module 124 is installed in the equipment bay 116 of the chassis 104. The load end 184 of the ejector lever 168 may be positioned proximate to the exterior portion 200 of the ejector block 156. As described in further detail below, the ejector block 156 may be movable between a neutral position and an ejecting position.

The guide pins 160 (i.e., the first guide pin 160a and the second guide pin 160b) may be connected to the ejector block 156 and positioned through the front panel 136 of the line module 124. In some implementations, the guide pins 160 are positioned through the front panel 136 proximate to the second side 152 of the front panel 136. As described in further detail below, the guide pins 160 may be configured to guide movement of the ejector block 156 between the neutral position and the ejecting position.

In some implementations, as shown in FIG. 4, the ejector assembly 128 may further comprise one or more retainer springs 204 (hereinafter, the "retainer springs 204") disposed on the guide pins 160—such as a first retainer spring 204a and a second retainer spring 204b shown in FIG. 4. The retainer springs 204 may be configured to bias the ejector block 156 to the neutral position and the ejector lever 168 to the closed position (i.e., the retainer springs 204 may exert elastic forces on the guide pins 160 to maintain proximity between the interior portion 196 of the ejector block 156 and the interior surface 144 of the front panel 136 of the first line module 124a).

In some implementations, one or more of the guide pins 160 may have a pin head 161 and a pin shaft 163. For purposes of clarity, only one of the pin heads 161 and only one of the pin shafts 163 is labeled with a reference character. In such implementations, the retainer springs 204 may be configured to fit over the pin shaft 163. The pin shaft 163 may be tubular having an internal opening. The retainer springs 204 may be configured to contact the pin head 161 and be compressed between the pin head 161 and the front panel 136 of the line module 124 when the ejector lever 168 moves the ejector block 156 from the neutral position to the closed position. As such, the retainer springs 204 may be configured to bias the ejector block 156 to the neutral position. For example, the retainer springs 204 may exert force against the pin head 161 and the front panel 136 when compressed, thereby moving the guide pins 160 and, therefore, by the attachment of the guide pins 160 to the ejector block 156, moving the ejector block 156 to the neutral position. In some implementations, the retainer springs 204 may be further configured to bias the ejector lever 168 in the closed position. For example, the ejector block 156 may contact the load end 184 of the ejector lever 168 and transmit the force from the retainer springs 204 to the load end 184 of the ejector lever 168.

Referring now to FIG. 5, shown therein is a back view of the front panel 136 of the line module assembly 132 shown in FIG. 4. In this view, the interior surface 144 of the front panel 136, the mounting bracket 164, the fastener 172, and the pivot portion 180 of the ejector lever 168 are visible.

As shown in FIG. 5, the mounting bracket 164 may have a first end 208 and a second end 212. The first end 208 of the mounting bracket 164 may be attached to the interior surface 144 of the front panel 136 and proximate to the second side 152 of the front panel 136. The second end 212 of the mounting bracket 164 may extend away from the interior surface 144 of the front panel 136. The second end 212 of the mounting bracket 164 may have a bracket opening 216 (shown in phantom in FIG. 5). Further, the pivot portion 180 of the ejector lever 168 may have a pivot opening 220 (shown in phantom in FIG. 5) positioned proximate to the bracket opening 216.

The fastener 172 may have a fastener head 224 and a fastener body 228. The fastener body 228 of the fastener 172 may be positioned through the bracket opening 216 of the second end 212 of the mounting bracket 164 and the pivot opening 220 of the pivot portion 180 of the ejector lever 168 such that the ejector lever 168 is pivotable about the fastener 172 between the closed position and the open position. Accordingly, the pivot portion 180 of the ejector lever 168 may be positioned between the fastener head 224 of the fastener 172 and the second end 212 of the mounting bracket 164.

Figure 6A:
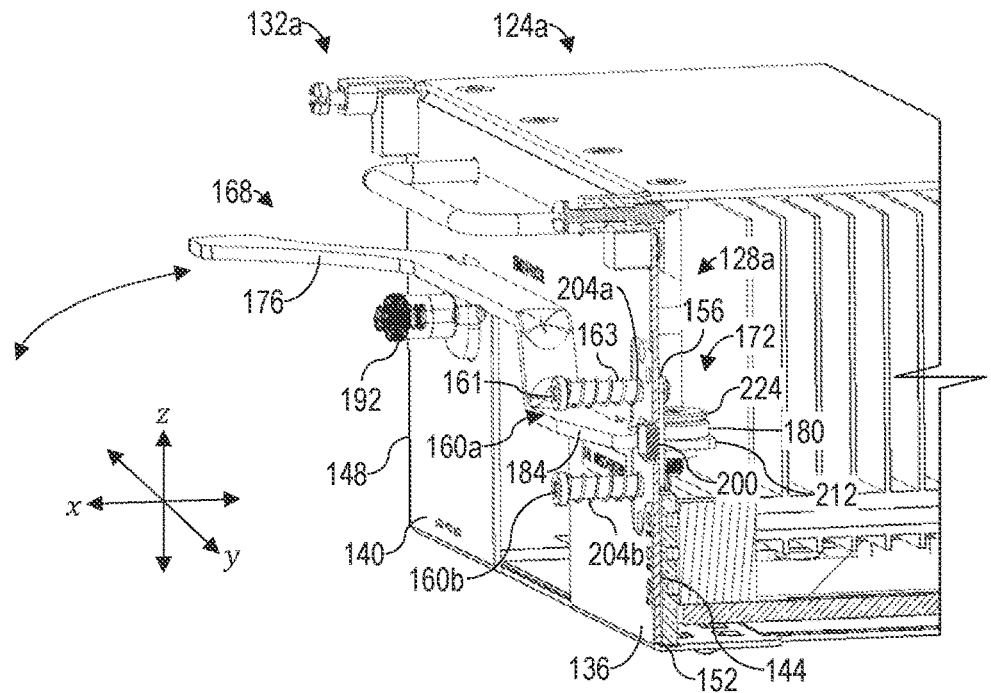
FIG. 6A is a partial cross-sectional view of the line module assembly shown in FIG. 5, taken along the line 6A-6A and in the direction of the arrows, wherein an ejector lever of the line module assembly is in a closed position and an ejector block of the line module assembly is in a neutral position.

Referring now to FIG. 6A, shown therein is a partial cross-sectional view of the line module assembly 132 shown in FIG. 5, taken along the line 6A-6A and in the direction of the arrows. In FIG. 6A, the ejector lever 168 is in the closed position and the ejector block 156 is in the neutral position.

With the ejector lever 168 in the closed position, the handle end 176 of the ejector lever 168 may be proximate to the exterior surface 140 of the front panel 136 of the line module 124. While the ejector lever 168 is in the closed position, the load end 184 of the ejector lever 168 may exert little to no force on the exterior portion 200 of the ejector block 156. In some implementations, while the ejector lever 168 is in the closed position, the load end 184 of the ejector lever 168 may be distanced from the exterior portion 200 of the ejector block 156.

Further, while the ejector lever 168 is in the closed position, the locking mechanism 192 may selectively maintain the ejector lever 168 in the closed position. That is, the locking mechanism 192 may be selectively secured to the front panel 136 of the line module 124 (e.g., by positioning a screw through the front panel 136 of the first line module 124*a*). Conversely, the locking mechanism 192 may be unsecured from the front panel 136 of the line module 124 to permit pivotal movement of the ejector lever 168 into the open position.

Figure 6B:
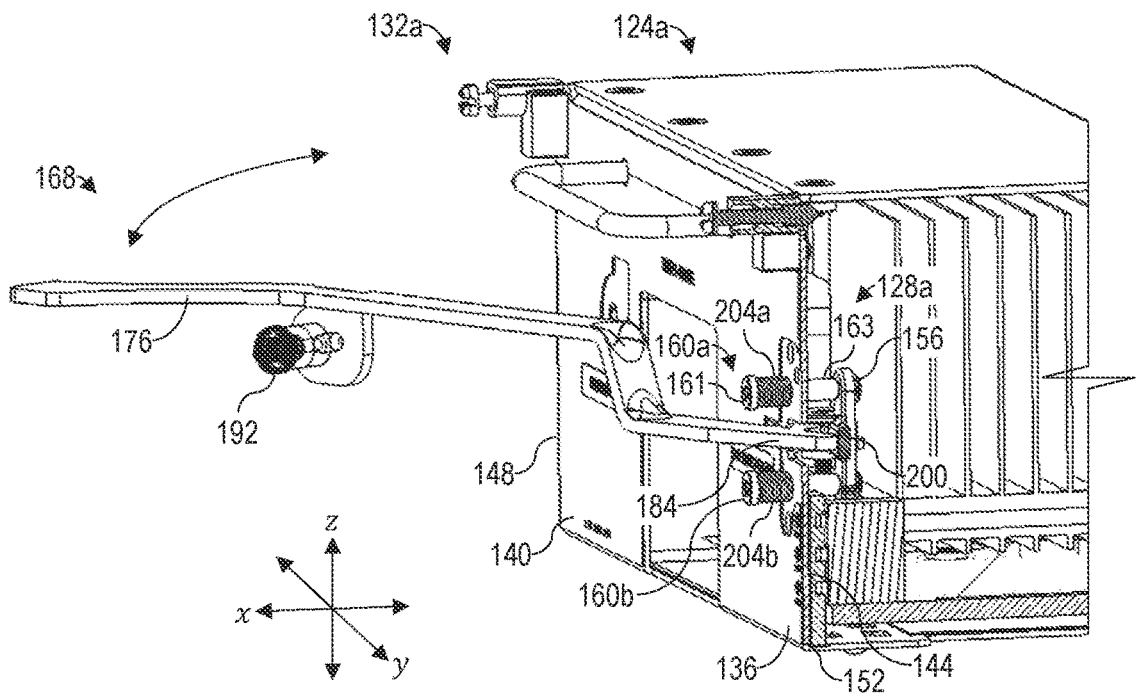
FIG. 6B is another view of the partial cross-sectional view of the line module assembly shown in FIG. 6A, wherein the ejector lever of the line module assembly is in an open position and an ejector block of the line module assembly is in an ejecting position.

Referring now to FIG. 6B, shown therein is another view of the partial cross-sectional view of the line module assembly 132 shown in FIG. 6A, wherein the ejector lever 168 is in the open position and the ejector block 156 is in the ejecting position. With the ejector lever 168 in the open position, the handle end 176 of the ejector lever 168 is positioned a distance from the exterior surface 140 of the front panel 136 of the line module 124. Further, when the ejector lever 168 is pivoted to the open position, the load end 184 of the ejector lever 168 may contact the exterior portion 200 of the ejector block 156 and move the ejector block 156 into the ejecting position, as shown in FIG. 6B.

The guide pins 160 may be configured to guide movement of the ejector block 156 between the neutral position and the ejecting position. That is, the guide pins 160 may be configured to restrict movement of the ejector block 156 to an x-axis shown in FIGS. 6A and 6B, thereby only permitting movement of the ejector block 156 in a first direction toward the back 112 of the chassis 104 (i.e., along the x-axis in a negative direction) and a second direction away from the back 112 of the chassis 104 (i.e., along the x-axis in a positive direction).

In order to eject the line module 124 from the equipment bay 116 of the chassis 104, a user may pull the handle end 176 of the ejector lever 168 in order to pivot the ejector lever 168 into the open position as shown in FIGS. 6A and 6B.

The ejector lever 168 may be configured to multiply an input force provided by a user, thereby resulting in a multiplied output force that is applied by the load end 184 of the ejector lever 168 to the exterior portion 200 of the ejector block 156, and by the exterior portion 200 of the ejector block 156 to the front 108 (e.g., the second partition 122*b*) of the chassis 104. The ejector assembly 128 may be configured such that the multiplied output force is sufficient to separate the line module 124 from the backplane connectors 126. The ejector lever 168 may be configured to multiply an input force provided by the user based on the transmission of force from the handle end 176 of the ejector lever 168 to the load end 184 of the ejector lever 168 contacting the exterior portion 200 of the ejector block 156 by pivoting about the pivot portion 180 of the ejector lever 168.

After ejecting the line module 124 from the equipment bay 116 of the chassis 104, a user may release the ejector lever 168 and move, or allow, the ejector lever 168 to return to the closed position, which may be aided by the guide pins 160 and the retainer springs 204.

A mechanical advantage provided by the ejector assembly 128 during the ejection of the line module 124 from the equipment bay 116 of the chassis 104 may be given by Equation (1) below:

$$\text{Mechanical Advantage} = F_{out}/F_{in} = L_{handle-pivot}/L_{pivot-load} \qquad (1)$$

where $F_{out}$ is the total force required to separate the line module 124 from the backplane connectors 126 (i.e., the force exerted on the front 108 of the chassis 104, such as on the front of the second partition 122*b* of the chassis 104), $F_{in}$ is the pull force applied by the user to the handle end 176 of the ejector lever 168, $L_{handle-pivot}$ is the distance between the handle end 176 of the ejector lever 168 and the pivot portion 180 of the ejector lever 168, and $L_{pivot-load}$ is the distance between the pivot portion 180 of the ejector lever 168 and the load end 184 of the ejector lever 168.

Figure 7A:
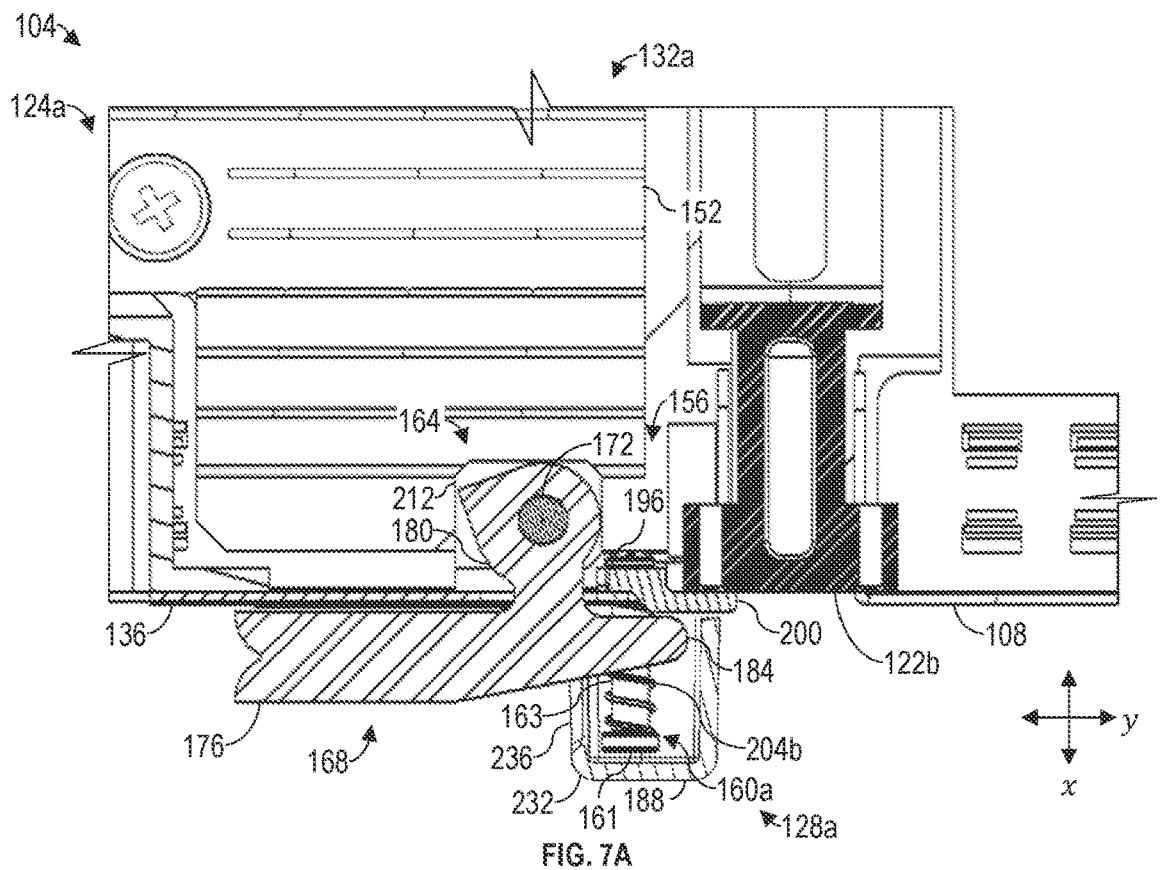
FIG. 7A is a partial cross-sectional view of the chassis shown in FIG. 2, taken along the line 7A-7A and in the direction of the arrows, wherein the ejector lever of the line module assembly is in the closed position and the ejector block of the line module assembly is in the neutral position.
Figure 7B:
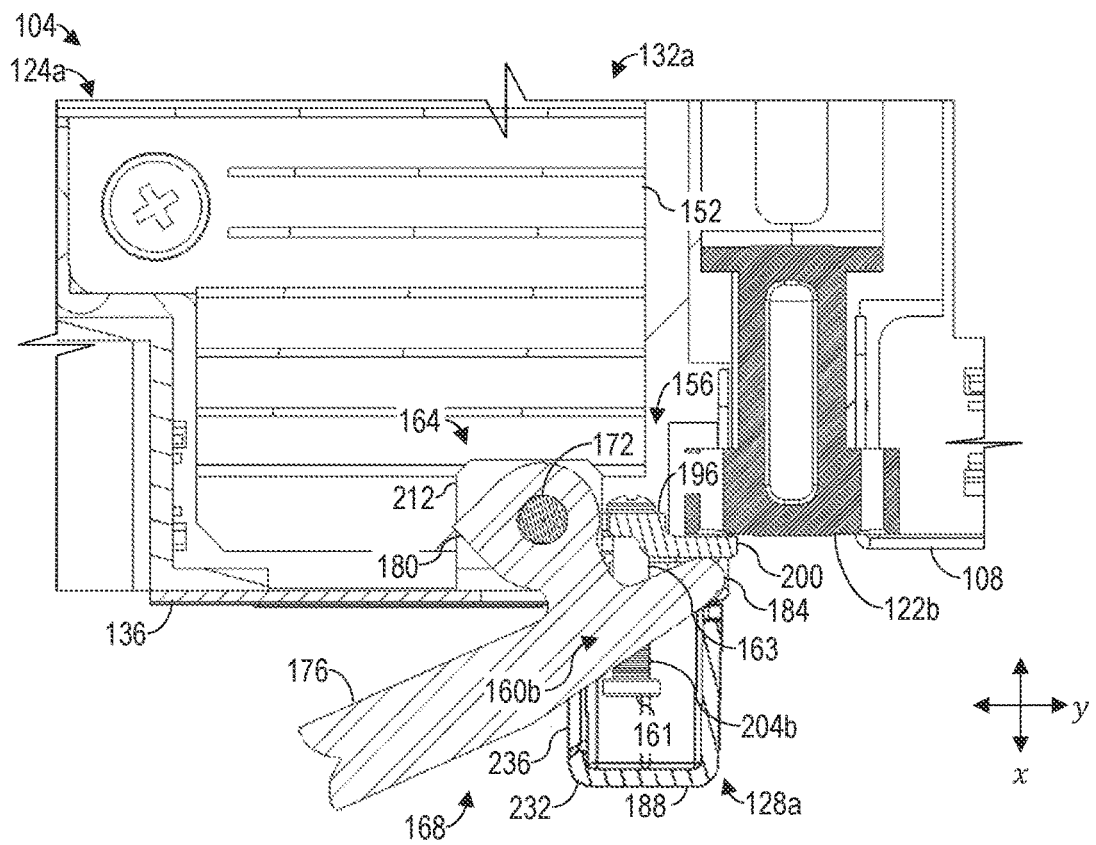
FIG. 7B is another view of the partial cross-sectional view of the chassis shown in FIG. 7A, wherein the ejector lever of the line module assembly is in the open position and the ejector block of the line module assembly is in the ejecting position.

Referring now to FIGS. 7A and 7B, shown therein are partial cross-sectional views of the chassis 104 shown in FIG. 2, taken along the line 7A-7A and in the direction of the arrows. In FIG. 7A, the ejector lever 168 is in the closed position and the ejector block 156 is in the neutral position. In FIG. 7B, the ejector lever 168 is in the open position and the ejector block 156 is in the ejecting position.

As shown in FIGS. 7A and 7B, when the ejector block 156 is moved into the ejecting position (i.e., when the ejector lever 168 is pivoted into the open position, and the load end 184 of the ejector lever 168 has contacted the exterior portion 200 of the ejector block 156 and moved the ejector block 156 into the ejecting position) and contacts the front 108 of the chassis 104 (e.g., the front of the second partition 122*b*), the ejector block 156 may be configured to apply a force to the front 108 of the chassis 104 (e.g., to the front of the second partition 122*b*) in the first direction (i.e., along the x-axis in a negative direction) toward the back 112 of the chassis 104.

The ejector block 156 applying the force to the front 108 of the chassis 104 in the first direction toward the back 112 of the chassis 104 may cause the line module 124 to move in the second direction (i.e., along the x-axis in a positive direction) away from the back 112 of the chassis 104. Causing the line module 124 to move in the second direction away from the back 112 of the chassis 104 may have the effect of ejecting the line module assembly 132 from the chassis 104.

As shown in FIG. 7B, the cover block 188 may be configured to limit movement of the ejector lever 168. That is, the cover block 188 may have a sidewall 232 defining an opening 236. The load end 184 of the ejector lever 168 may be positioned through the opening 236 of the cover block 188. When the ejector lever 168 is pivoted into the open position, the handle end 176 of the ejector lever 168 may contact the sidewall 232 of the cover block 188, thereby preventing movement of the ejector lever 168 beyond a predetermined distance, and in some implementations, preventing movement of the ejector lever 168 beyond the open position.

Figure 8:
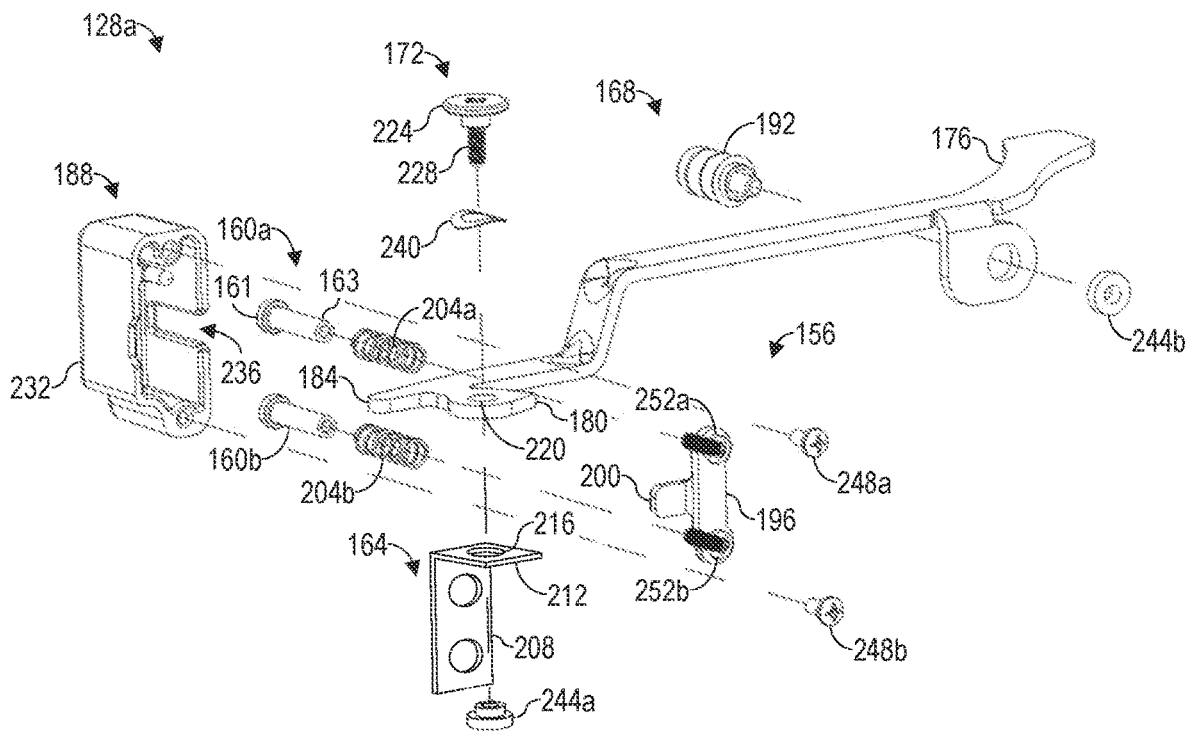
FIG. 8 is an exploded perspective view of an ejector assembly of the line module assembly shown in FIG. 3.

Referring now to FIG. 8, shown therein is an exploded perspective view of the ejector assembly 128 shown in FIG. 3. As shown in FIG. 8, in some implementations, the ejector assembly 128 may further comprise a wave washer 240 positioned between the fastener head 224 of the fastener 172 and the pivot portion 180 of the ejector lever 168. The wave washer 240 may be configured to bear an axial compressive load of the fastener 172 and to serve as a buffer for the ejector lever 168.

In some implementations, the ejector assembly 128 may further comprise a plurality of clinch nuts 244—such as a first clinch nut 244a and a second clinch nut 244b shown in FIG. 8, for example. The first clinch nut 244a may be configured to attach to the fastener 172 so as to stabilize the pivot portion 180 of the ejector lever 168 on the fastener 172. In some implementations, the wave washer 240 may be positioned between the pivot portion 180 of the ejector lever 168 and the second end 212 of the mounting bracket 164. In some implementations, the second clinch nut 244b may be configured to selectively secure the locking mechanism 192 to the front panel 136 of the line module 124.

In some implementations, the ejector assembly 128 may further comprise one or more cover block fasteners 248 (hereinafter, the "cover block fasteners 248")—such as a first cover block fastener 248a and a second cover block fastener 248b shown in FIG. 8, for example. The cover block fasteners 248 (i.e., the first cover block fastener 248a and the second cover block fastener 248b) may be configured to attach the cover block 188 to the front panel 136 of the line module 124.

In some implementations, the ejector assembly 128 may further comprise one or more ejector block fasteners 252 (hereinafter, the "ejector block fasteners 252")—such as a first ejector block fastener 252a and a second ejector block fastener 252b shown in FIG. 8, for example. In some implementations, the ejector block fasteners 252 (i.e., the first ejector block fastener 252a and the second ejector block fastener 252b) may be configured to be connected to the guide pins 160 so as to hold the ejector block 156 in place in relation to the interior surface 144 of the front panel 136 of the line module 124. For example, the ejector block fasteners 252 may be positioned through the ejector block 156 and connected to (such as a threaded connection or press fit) the guide pins 160. In some implementations, the guide pins 160 may be tubular such that a guide pin 160 internally accepts a portion of the ejector block fastener 252.

In some implementations, the ejector block 156 may have tubular protrusions and/or spacers positioned between the interior portion 196 of the ejector block 156 and the interior surface 144 of the front panel 136 and configured to space the ejector block 156 from the front panel 136.

Figure 9:
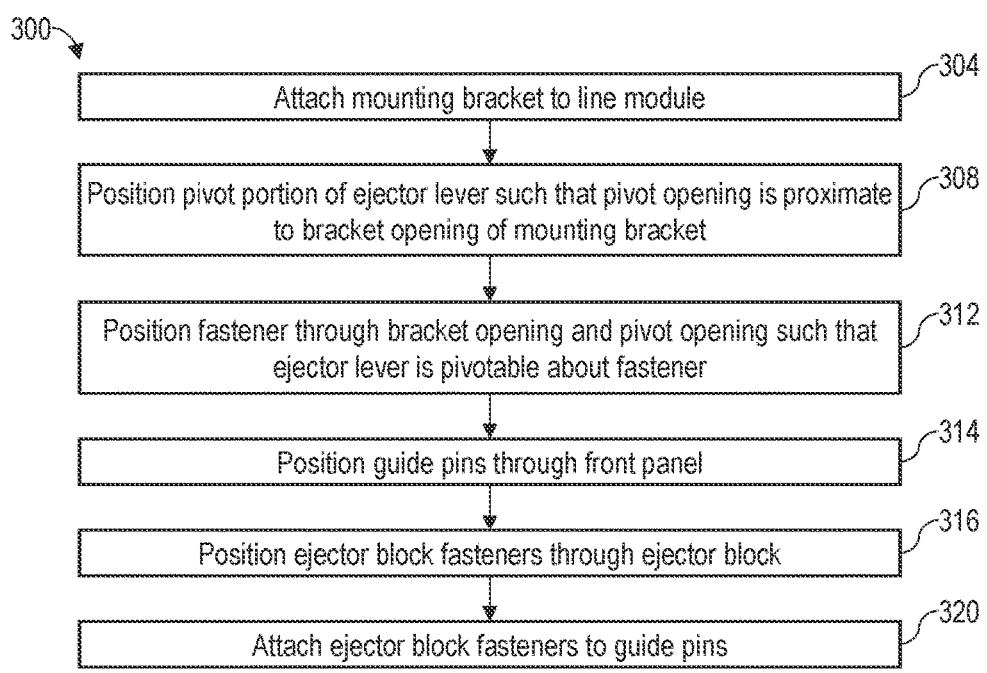
FIG. 9 is a diagrammatic view of a method of making an exemplary line module assembly in accordance with the present disclosure.

Referring now to FIG. 9, shown therein is a diagrammatic view of an exemplary implementation of a method 300 of making an exemplary line module assembly 132 in accordance with the present disclosure. As shown in FIG. 9, the method 300 may comprise the steps of: attaching a mounting bracket 164 to a line module 124 configured to be installed within the equipment bay 116 of the chassis 104 of the networking device 100 (step 304); positioning a pivot portion 180 of an ejector lever 168 such that a pivot opening 220 of the pivot portion 180 of the ejector lever 168 is proximate to a bracket opening 216 of a second end 212 of the mounting bracket 164 (step 308); positioning a fastener 172 through the bracket opening 216 of the second end 212 of the mounting bracket 164 and the pivot opening 220 of the pivot portion 180 of the ejector lever 168 such that the ejector lever 168 is pivotable about the fastener 172 between a closed position in which a handle end 176 of the ejector lever 168 is proximate to the exterior surface 140 of the front panel 136 of the line module 124 and an open position in which the handle end 176 is distanced from the exterior surface 140 of the front panel 136 of the line module 124 (step 312); positioning the guide pins 160 through the front panel 136 (step 314); positioning the ejector block fasteners 252 through the ejector block 156 (step 316); and attaching the ejector block fasteners 252 to the guide pins 160, such as by threading the ejector block fasteners 252 into the guide pins 160, so as to position the interior portion 196 of the ejector block 156 proximate to the interior surface 144 of the front panel 136 and proximate to the second side 152 of the front panel 136 (step 320).

In some implementations, the step of attaching the mounting bracket 164 to the line module 124 (step 304) is further defined as attaching the mounting bracket 164 to the line module 124 configured to be installed within the equipment bay 116 of the chassis 104 of the networking device 100, the line module 124 having the front panel 136, the front panel 136 having the exterior surface 140, the interior surface 144, a first side 148, and the second side 152 positioned opposite the first side 148, the mounting bracket 164 having a first end 208 attached to the interior surface 144 of the front panel 136 of the line module 124 proximate to the second side 152 of the front panel 136, the mounting bracket 164 having a second end 212 extending away from the interior surface 144 of the front panel 136 and having the bracket opening 216.

In some implementations, the step of positioning the pivot portion 180 of the ejector lever 168 such that the pivot opening 220 of the pivot portion 180 of the ejector lever 168 is proximate to the bracket opening 216 of the second end 212 of the mounting bracket 164 (step 308) is further defined as positioning the pivot portion 180 of the ejector lever 168 such that the pivot opening 220 of the pivot portion 180 of the ejector lever 168 is proximate to the bracket opening 216 of the second end 212 of the mounting bracket 164, the ejector lever 168 having the pivot portion 180, the handle end 176, and the load end 184.

In some implementations, the step of positioning the fastener 172 through the bracket opening 216 of the second end 212 of the mounting bracket 164 and the pivot opening 220 of the pivot portion 180 of the ejector lever 168 (step 312) is further defined as positioning the fastener 172 through the bracket opening 216 of the second end 212 of the mounting bracket 164 and the pivot opening 220 of the pivot portion 180 of the ejector lever 168 such that the ejector lever 168 is pivotable about the fastener 172 between a closed position in which the handle end 176 is proximate to the exterior surface 140 of the front panel 136 of the line module 124 and an open position in which the handle end 176 is distanced from the exterior surface 140 of the front panel 136 of the line module 124.

In some implementations, the step of attaching the interior portion 196 of the ejector block 156 to the interior surface 144 of the front panel 136 proximate to the second side 152 of the front panel 136 (step 316) is further defined as attaching the interior portion 196 of the ejector block 156 to the interior surface 144 of the front panel 136 proximate to the second side 152 of the front panel 136, the ejector block 156 having an exterior portion 200 positioned outside of the equipment bay 116 and proximate to the front 108 of the chassis 104 when the line module 124 is installed in the equipment bay 116 of the chassis 104, the load end 184 of the ejector lever 168 positioned proximate to the exterior portion 200 of the ejector block 156, the ejector block 156 movable between a neutral position and an ejecting position, the ejector block 156 configured to apply a force to the front 108 of the chassis 104 in a first direction toward the back 112 of the chassis 104 when the ejector block 156 is moved into the ejecting position and contacts the front 108 of the chassis 104, thereby moving the line module 124 in a second direction away from the back 112 of the chassis 104 when the load end 184 of the ejector lever 168 has contacted and moved the ejector block 156 into the ejecting position.

In some implementations, the step of attaching the one or more guide pins 160 to the ejector block 156 (step 320) is further defined as attaching the one or more guide pins 160 to the ejector block 156, the one or more guide pins 160 configured to guide movement of the ejector block 156 between the neutral position and the ejecting position.

In some implementations, the step of attaching the one or more guide pins 160 to the ejector block 156 (step 320) further comprises positioning one or more retainer springs 204 on the one or more guide pins 160, the one or more retainer springs 204 configured to bias the ejector lever 168 in the neutral position.

In some implementations, the method 300 further comprises the step of securing a locking mechanism 192 to the front panel 136 of the line module 124, the locking mechanism 192 configured to be selectively secured to the front panel 136 of the line module 124 and to selectively maintain the ejector lever 168 in the closed position.

Figure 10:
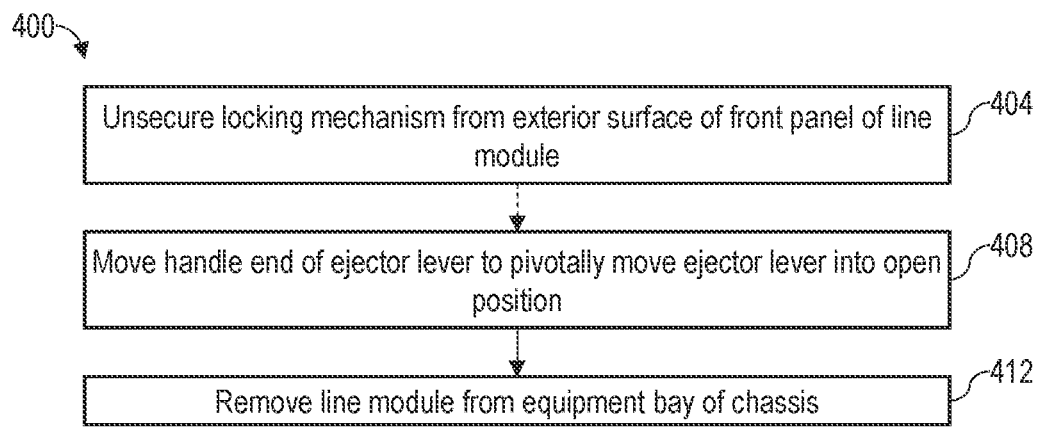
FIG. 10 is a diagrammatic view of a method of using an exemplary line module assembly in accordance with the present disclosure.

Referring now to FIG. 10, shown therein is a diagrammatic view of an exemplary implementation of a method 400 of using the line module assembly 132. As shown in FIG. 10, the method 400 may comprise the steps of: optionally, unsecuring a locking mechanism 192 selectively secured to an exterior surface 140 of a front panel 136 of a line module 124 installed within an equipment bay 116 of a chassis 104 of a networking device 100, the locking mechanism 192 configured to selectively maintain an ejector lever 168 in a closed position, thereby permitting pivotal movement of the ejector lever 168 about a fastener 172 from the closed position into an open position (step 404); moving a handle end 176 of the ejector lever 168 to pivotally move the ejector lever 168 about the fastener 172 from the closed position into the open position (step 408); and removing the line module 124 from the equipment bay 116 of the chassis 104 (step 412).

In some implementations, the step of unsecuring the locking mechanism 192 selectively secured to the exterior surface 140 of the front panel 136 of the line module 124 (step 404) is further defined as unsecuring the locking mechanism 192, for example, by removing a second clinch nut 244b configured to selectively secure the locking mechanism 192 to the front panel 136 of the line module 124, selectively secured to the exterior surface 140 of the front panel 136 of the line module 124 installed within the equipment bay 116 of the chassis 104 of the networking device 100, the locking mechanism 192 configured to selectively maintain the ejector lever 168 in the closed position, thereby permitting pivotal movement of the ejector lever 168 about the fastener 172 from the closed position into the open position, the line module 124 having the front panel 136, the front panel 136 having the exterior surface 140, an interior surface 144, a first side 148, and a second side 152 opposite the first side 148, the chassis 104 having a front 108 and a back 112 opposite the front 108 and having a chassis opening 120 configured to receive the line module 124 into the equipment bay 116 of the chassis 104, the ejector lever 168 in the closed position having a handle end 176 of the ejector lever 168 proximate to the exterior surface 140 of the front panel 136 of the line module 124, the ejector lever 168 in the open position having the handle end 176 of the ejector lever 168 distanced from the exterior surface 140 of the front panel 136 of the line module 124 and a load end 184 of the ejector lever 168 contacting an exterior portion 200 of an ejector block 156 and moving the ejector block 156 from a neutral position into an ejecting position.

In some implementations, the step of moving the handle end 176 of the ejector lever 168 to pivotally move the ejector lever 168 about the fastener 172 from the closed position into the open position (step 408) is further defined as moving the handle end 176 of the ejector lever 168 to pivotally move the ejector lever 168 about the fastener 172 from the closed position into the open position, thereby causing the exterior portion 200 of the ejector block 156 to contact the front 108 of the chassis 104 and to apply a force to the front 108 of the chassis 104 in a first direction toward a back 112 of the chassis 104, thereby moving the line module 124 in a second direction away from the back 112 of the chassis 104, the ejector lever 168 having the handle end 176, a pivot portion 180, and the load end 184, the load end 184 positioned proximate to the exterior portion 200 of an ejector block 156, the pivot portion 180 having a pivot opening 220 positioned proximate to a bracket opening 216 of a second end 212 of a mounting bracket 164, the mounting bracket 164 having a first end 208 attached to the interior surface 144 of the front panel 136 of the line module 124 proximate to the second side 152 of the front panel 136, the mounting bracket 164 having the second end 212 extending away from the interior surface 144 of the front panel 136 and having the bracket opening 216, the fastener 172 positioned through the bracket opening 216 of the second end 212 of the mounting bracket 164 and the pivot opening 220 of the pivot portion 180 of the ejector lever 168 such that the ejector lever 168 is pivotable about the fastener 172 between the closed position and the open position, the ejector block 156 having an interior portion 196 and the exterior portion 200, the interior portion 196 connected to the interior surface 144 of the front panel 136 and positioned proximate to the second side 152 of the front panel 136, the exterior portion 200 positioned outside of the equipment bay 116 and proximate to the front 108 of the chassis 104 when the line module 124 is installed in the equipment bay 116 of the chassis 104, wherein one or more guide pins 160 are connected to the ejector block 156 and configured to guide movement of the ejector block 156 between the neutral position and the ejecting position.

In some implementations, the step of removing the line module 124 from the equipment bay 116 of the chassis 104 (step 412) is further defined as removing the line module 124 from the equipment bay 116 of the chassis 104 via the chassis opening 120 defined by the front 108 of the chassis 104 by moving the line module 124 in the second direction away from the back 112 of the chassis 104.

In some implementations, the method 400 does not include the step of unsecuring the locking mechanism 192 from the front panel 136 of the line module 124 (step 404) and instead begins with the step of moving the handle end 176 of the ejector lever 168 to pivotally move the ejector lever 168 into the open position (step 408).

In some implementations, the method 400 further comprises the step of, subsequent to moving the handle end 176 of the ejector lever 168 to pivot the ejector lever 168 into the open position (step 408), resecuring the locking mechanism 192 to the exterior surface 140 of the front panel 136 of the line module 124.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Even though particular combinations of features are recited in the claims and/or disclosed in the specification, these combinations are not intended to limit the disclosure. In fact, many of these features may be combined in ways not specifically recited in the claims and/or disclosed in the specification. Although each dependent claim listed below may directly depend on only one other claim, the disclosure includes each dependent claim in combination with every other claim in the claim set.

No element, act, or instruction used in the present application should be construed as critical or essential to the invention unless explicitly described as such outside of the preferred implementation. Further, the phrase "based on" is intended to mean "based, at least in part, on" unless explicitly stated otherwise.

What is claimed is:

1. An assembly for ejecting a line module from an equipment bay of a chassis of a networking device, wherein the chassis has a back and a front opposite the back having a chassis opening configured to receive the line module into the equipment bay of the chassis, wherein the line module is configured to be installed within the equipment bay of the chassis of the networking device, the line module having a front panel, the front panel having an exterior surface, an interior surface, a first side, and a second side opposite the first side, the assembly comprising:

an ejector block having an interior portion connected to the interior surface of the front panel and positioned proximate to the second side of the front panel, and having an exterior portion positioned outside of the equipment bay and proximate to the front of the chassis when the line module is installed in the equipment bay of the chassis, the ejector block movable between a neutral position and an ejecting position, the ejector block configured to apply a force to the front of the chassis in a first direction toward the back of the chassis when the ejector block is moved into the ejecting position and contacts the front of the chassis, thereby moving the line module in a second direction away from the back of the chassis;

one or more guide pins connected to the ejector block and configured to guide movement of the ejector block between the neutral position and the ejecting position;

a mounting bracket having a first end attached to the interior surface of the front panel of the line module proximate to the second side of the front panel, the mounting bracket having a second end extending away from the interior surface of the front panel and having a bracket opening;

an ejector lever having a handle end, a pivot portion, and a load end, the load end positioned proximate to the exterior portion of the ejector block, the pivot portion having a pivot opening positioned proximate to the bracket opening of the second end of the mounting bracket; and a fastener positioned through the bracket opening of the second end of the mounting bracket and the pivot opening of the pivot portion of the ejector lever such that the ejector lever is pivotable about the fastener between a closed position in which the handle end is proximate to the exterior surface of the front panel of the line module and an open position in which the handle end is distanced from the exterior surface of the front panel of the line module and the load end has contacted and moved the ejector block into the ejecting position.

2. The assembly of claim 1, further comprising one or more retainer springs disposed on the one or more guide pins, the one or more retainer springs configured to bias the ejector block to the neutral position.

3. The assembly of claim 1, further comprising a cover block disposed over the one or more guide pins, the cover block configured to limit movement of the ejector lever.

4. The assembly of claim 1, further comprising a locking mechanism configured to selectively maintain the ejector lever in the closed position.

5. The assembly of claim 1, wherein the one or more guide pins are positioned through the front panel of the line module.

6. The assembly of claim 2, wherein the one or more retainer springs are further configured to bias the ejector lever in the closed position.

7. The assembly of claim 6, wherein the fastener has a head, wherein the pivot portion of the ejector lever is positioned between the head of the fastener and the second end of the mounting bracket, the assembly comprising a wave washer positioned between the head of the fastener and the pivot portion of the ejector lever.

8. The assembly of claim 1, wherein the equipment bay has one or more backplane connectors positioned in the equipment bay proximate to the back of the chassis, the line module further configured to be communicatively coupled to at least one of the one or more backplane connectors, the line module further configured to be separable from the one or more backplane connectors with the force.

9. A line module assembly for an equipment bay of a chassis of a networking device, wherein the chassis has a back and a front having a chassis opening configured to receive a line module into the equipment bay of the chassis, the line module assembly comprising:

a line module configured to be installed within the equipment bay of the chassis of the networking device, the line module having a front panel, the front panel having an exterior surface, an interior surface, a first side, and a second side positioned opposite the first side;

an ejector block having an interior portion connected to the interior surface of the front panel and positioned proximate to the second side of the front panel, and having an exterior portion positioned outside of the equipment bay and proximate to the front of the chassis when the line module is installed in the equipment bay of the chassis, the ejector block movable between a neutral position and an ejecting position, the ejector block configured to apply a force to the front of the chassis in a first direction toward the back of the chassis when the ejector block is moved into the ejecting position and contacts the front of the chassis, thereby moving the line module in a second direction away from the back of the chassis;

one or more guide pins connected to the ejector block and configured to guide movement of the ejector block between the neutral position and the ejecting position;

a mounting bracket having a first end attached to the interior surface of the front panel of the line module proximate to the second side of the front panel, the mounting bracket having a second end extending away from the interior surface of the front panel and having a bracket opening;

an ejector lever having a handle end, a pivot portion, and a load end, the load end positioned proximate to the exterior portion of the ejector block, the pivot portion having a pivot opening positioned proximate to the bracket opening of the second end of the mounting bracket; and a fastener positioned through the bracket opening of the second end of the mounting bracket and the pivot opening of the pivot portion of the ejector lever such that the ejector lever is pivotable about the fastener between a closed position in which the handle end is proximate to the exterior surface of the front panel of the line module and an open position in which the handle end is distanced from the exterior surface of the front panel of the line module and the load end has contacted and moved the ejector block into the ejecting position.

10. The line module assembly of claim 9, wherein the one or more guide pins are positioned through the front panel of the line module.

11. The line module assembly of claim 10, further comprising one or more retainer springs disposed on the one or more guide pins, the one or more retainer springs configured to bias the ejector block to the neutral position.

12. The line module assembly of claim 11, wherein the one or more retainer springs are further configured to bias the ejector lever in the closed position.

13. The line module assembly of claim 9, further comprising a cover block disposed over the one or more guide pins.

14. The line module assembly of claim 9, further comprising a locking mechanism configured to selectively maintain the ejector lever in the closed position.

15. The line module assembly of claim 9, wherein the fastener has a head, wherein the pivot portion of the ejector lever is positioned between the head of the fastener and the second end of the mounting bracket.

16. The line module assembly of claim 15, the line module assembly comprising a wave washer positioned between the head of the fastener and the pivot portion of the ejector lever.

17. The line module assembly of claim 9, further comprising a cover block disposed over the one or more guide pins, the cover block configured to limit movement of the ejector lever.

18. The line module assembly of claim 15, wherein the equipment bay has one or more backplane connectors positioned in the equipment bay proximate to the back of the chassis, the line module configured to be communicatively coupled to the one or more backplane connectors, the line module configured to be separable from the one or more backplane connectors with the force.

19. A method of making a removable line module assembly for an equipment bay of a chassis of a networking device, wherein the chassis has a back and has a front having a chassis opening configured to receive a line module into the equipment bay in the chassis, the method comprising:

attaching a mounting bracket to a line module configured to be installed within the equipment bay of the chassis of the networking device, the line module having a front panel, the front panel having an exterior surface, an interior surface, a first side, and a second side positioned opposite the first side, the mounting bracket having a first end attached to the interior surface of the front panel of the line module proximate to the second side of the front panel, the mounting bracket having a second end extending away from the interior surface of the front panel and having a bracket opening;

positioning a pivot portion of an ejector lever such that a pivot opening of the pivot portion of the ejector lever is proximate to the bracket opening of the second end of the mounting bracket, the ejector lever having the pivot portion, a handle end, and a load end;

positioning a fastener through the bracket opening of the second end of the mounting bracket and the pivot opening of the pivot portion of the ejector lever such that the ejector lever is pivotable about the fastener between a closed position in which the handle end is proximate to the exterior surface of the front panel of the line module and an open position in which the handle end is distanced from the exterior surface of the front panel of the line module;

attaching an interior portion of an ejector block to the interior surface of the front panel, proximate to the second side of the front panel, the ejector block having an exterior portion positioned outside of the equipment bay and proximate to the front of the chassis when the line module is installed in the equipment bay of the chassis, the load end of the ejector lever positioned proximate to the exterior portion of the ejector block, the ejector block movable between a neutral position and an ejecting position, the ejector block configured to apply a force to the front of the chassis in a first direction toward the back of the chassis when the ejector block is moved into the ejecting position and contacts the front of the chassis, thereby moving the line module in a second direction away from the back of the chassis, when the load end of the ejector lever has contacted and moved the ejector block into the ejecting position; and attaching one or more guide pins to the ejector block, the one or more guide pins configured to guide movement of the ejector block between the neutral position and the ejecting position.

20. The method of claim 19, wherein attaching the one or more guide pins to the ejector block further comprises positioning one or more retainer springs on the one or more guide pins, the one or more retainer springs configured to bias the ejector lever in the neutral position.

* * * * *